United States Patent [19]

Takagi et al.

[11] 4,281,029
[45] Jul. 28, 1981

[54] METHOD OF COATING WITH A STOICHIOMETRIC COMPOUND

[76] Inventors: Toshinori Takagi, 10-3 Tomooka 2-chome, Nagaokakyo-shi, Kyoto-fu; Kiyoshi Morimoto; Hiroshi Watanabe, both of Futaba Denshi Kogyo K.K. 629, Oshiba, Mobara-shi, Chiba-ken, all of Japan

[21] Appl. No.: 80,220

[22] Filed: Oct. 1, 1979

Related U.S. Application Data

[62] Division of Ser. No. 877,502, Feb. 13, 1978, abandoned.

[30] Foreign Application Priority Data

Mar. 10, 1977 [JP] Japan ................................. 52-25494

[51] Int. Cl.³ ........................ B05D 3/06; C23C 13/08; H01L 7/36
[52] U.S. Cl. ...................................... 427/38; 427/85; 427/87
[58] Field of Search ................. 148/175, 1.5; 156/611, 156/612, 613; 427/85-87, 82, 91, 38-41, 99, 93-95

[56] References Cited

U.S. PATENT DOCUMENTS

| | | |
|---|---|---|
| 3,127,226 | 3/1964 | Rector . |
| 3,839,084 | 10/1974 | Cho et al. ............................. 156/611 |
| 3,974,059 | 8/1976 | Murayama . |
| 4,082,636 | 4/1978 | Takagi ............................ 118/723 X |

FOREIGN PATENT DOCUMENTS

2547552 4/1976 Fed. Rep. of Germany ........... 118/726

OTHER PUBLICATIONS

Jo. of Crystal Growth, 31 (1975), pp. 333-338, "Synthesis and Epitaxial Growth of Catefilms by Neutral and Ionized Beams", Veda.

Jo. Vac. Sci. Tech., vol. 13, No. 4, Jul./Aug. 1976, pp. 920-925, "Surface Charge Transport InPbs$_x$Se$_{l-x}$ and Pb$_{l-y}$SnySe", Jensen et al.

The Review of Sci. Instruments, vol. 41, No. 11, Nov. 1970, pp. 1654-1657, Beecham, "Cadmium/Sulfur Isothermal Source for CdS Deposition".

Primary Examiner—Morris Kaplan
Attorney, Agent, or Firm—Oblon, Fisher, Spivak, McClelland & Maier

[57] ABSTRACT

A method of coating which comprises the steps of separately vaporizing a plurality of substances containing the component elements of a desired compound and placed in a plurality of crucibles to form vapors of the substances, mixing the vapors in a heated mixing chamber to form a mixed vapor, jetting the mixed vapor into a vacuum region to form clusters, ionizing the clusters to form cluster ions, and accelerating the cluster ions to make them impinge on a substrate.

An apparatus for coating which comprises a plurality of crucibles for separately vaporizing substances containing the component elements of a desired compound to form vapors of the substances, a mixing chamber for heating and mixing the vapors introduced therein to form a mixed vapor, the mixing chamber having at least one injection hole for jetting the mixed vapor into a vacuum region, communication pipes for connecting the mixing chamber to the crucibles, an ionization chamber for ionizing clusters produced from the mixed vapor jetted from the mixing chamber, means for accelerating cluster ions produced in the ionization chamber and making them impinge on a substrate, and a substrate holder for holding the substrate.

4 Claims, 7 Drawing Figures

METHOD OF COATING WITH A STOICHIOMETRIC COMPOUND

This is a division, of application Ser. No. 877,502, filed Feb. 13, 1978, now abandoned.

BACKGROUND OF THE INVENTION

1. Field of the Invention

The present invention relates to a method for producing compounds, and more particularly to a method which can produce a high-quality compound having a predetermined stoichiometric composition.

2. Description of the Prior Art

Recently, a variety of compounds have been employed as electronic materials, for instance, semiconductors, magnetic materials, dielectrics and piezoelectric materials. The advent of these electronic materials made of compounds has made it possible to develop sophisticated devices or elements having new and novel characteristics. For instance, in the field of semiconductors, element semiconductors consisting singly of silicon, germanium or the like were exclusively used in the beginning. However, compound semiconductors consisting of at least two kinds of elements such as of Groups II and VI or Groups III and V have been recently developed and put into practical use as light-emitting diodes, semiconductor lasers, and the like.

The compound semiconductors of the kind mentioned above have great advantages in that the band gap or energy gap thereof can be freely changed by changing the kinds and proportions of the component elements thereof. Therefore, the light-emitting diode can be made to emit light of any wavelength in the range from red to green. Also, the compound semiconductors are very high in electron mobility and are being put into practical use as ultra high frequency devices, microwave solid-state oscillators, laser oscillators, and the like.

In the conventional physical evaporation processes such as vacuum deposition and ion plating, the compound semiconductors were produced by, for instance, vaporizing and depositing the component elements in a low-pressure gaseous atmosphere or in a vacuum region. Each of these processes however, has the following disadvantages.

In order to produce a compound having a stoichiometric composition, a special apparatus and complicated operations are required because the component elements of the compound are different in chemical and thermodynamic properties from one another.

In addition, the III-V compound semiconductor, for instance, is a high-melting-point compound and contains phosphorus (P) and arsenic (As) of Group V which are very high in vapor pressure. Therefore, when a substrate is heated to make the semiconductor epitaxially grow thereon, substances which are high in vapor pressure such as phosphorus and arsenic tend to escape therefrom. Thus, the conventional process cannot produce III-V compound semiconductors high in crystal quality unless the substrate is placed in a high-pressure atmosphere containing large amounts of phosphorus and arsenic.

Accordingly, in the case of the above-mentioned conventional process, it is necessary to supply phosphorus and arsenic more than other component elements so that phosphorus and arsenic that have been re-vaporized may be replenished. As a result, the yield of the product is very poor.

As mentioned above, the component elements of the compound semiconductor are widely different in melting point and vapor pressure from one another. Thus, when a high quality film is to be formed, the conventional process mentioned above encounters much difficulties in controlling the temperature of the crucible for vaporizing the materials of the film and in homogeneously mixing two or more component elements of the film, which requires very complicated operations.

SUMMARY OF THE INVENTION

Thus, the present invention contemplates to eliminate the above-mentioned disadvantages of the prior art.

It is an object of the present invention to provide a method for producing compounds, which can easily produce a compound consisting of component elements different in phisical and thermodynamic properties.

It is another object of the present invention to provide a method and apparatus, which can easily produce a compound having a predetermined stoichiometric composition.

It is still another object of the present invention to provide a method, which can form a uniform compound throughout the entire surface of a substrate.

It is a further object of the present invention to provide a method, which can produce a compound at a very high yield.

It is a still further object of the present invention to provide a method for producing compounds, which can easily control the conduction type of the compounds.

It is still another object of the present invention to provide a method, which can easily produce compounds such as nitrides and oxides.

It is a further object of the present invention to provide a method, which can form a compound high in crystal quality on a substrate.

It is a further object of the present invention to provide a method, which can form a compound film even on an insulating substrate.

It is a still further object of the present invention to provide a method for producing compounds, which can simplify the production process.

It is still another object of the present invention to provide a process for producing compounds, which can be made simple and compact.

According to one aspect of the present invention, there is provided a method for producing compounds, in which either the component elements of a desired compound or compounds containing the respective component elements of the desired compound are separately placed in a plurality of crucibles respectively. The crucibles are heated to generate vapors of the above component elements respectively, while controlling pressures of the above vapors separately according to the stoichiometric composition of the above desired compound, then the vapors are fed to a mixing chamber heated, where they are uniformly mixed into a mixed vapor. The mixed vapor is jetted into a high vacuum region through one or more injection holes or nozzles of the mixing chamber to form atomic groups known as clusters, and these clusters are deposited on a substrate to form thereon a film of the desired compound high in quality and having a predetermined stoichiometric composition.

According to another aspect of the present invention, there is provided a method for producing compounds, in which the above clusters are ionized into cluster ions and these cluster ions are given kinetic energy by application of a high voltage so that they may impinge on the substrate thereby forming thereon a film of the desired compound efficiently.

DETAILED DESCRIPTION OF THE PREFERRED EMBODIMENTS

Figure 1:
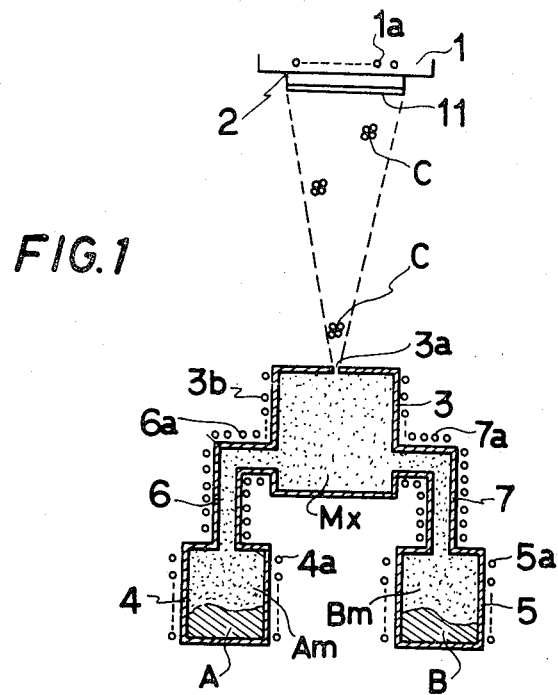
FIG. 1 is a diagrammatic drawing showing the construction of an apparatus for producing compounds according to one preferred embodiment of the present invention.

Now, a preferred embodiment of the present invention will be hereinafter described with reference to FIG. 1, which shows schematically an example of the apparatus for use in carrying out the method of producing compounds according to the present invention. All the parts of the apparatus shown in FIG. 1 are disposed in a high vacuum atmosphere, the pressure of which is $10^{-2}$ Torr or less, preferably $10^{-4}$ Torr or less.

Reference numeral 1 designates a substrate holder for holding a substrate 2 made of semiconductive material, magnetic material or the like on which a film of a desired compound is to be formed. If necessary, the substrate holder 1 may be provided with a heating device 1a for keeping the substrate 2 at the epitaxial temperature or higher. Reference numeral 3 designates a mixing chamber having at least one small-diameter injection hole (injection nozzle) thereon. The mixing chamber 3 mixes vapors of the component elements of a desired compound into a mixed vapor and produces clusters from the mixed vapor. Around the mixing chamber 3, there is provided a heating device 3b for keeping the chamber 3 at a predetermined temperature.

Reference numerals 4 and 5 designate crucibles each of which contains substances-to-be-vaporized A and B which consist either of the component elements of a desired compound or of compounds containing the above component elements respectively. Around the crucibles 4 and 5, there are provided heating devices or elements 4a and 5a, respectively. The heating devices 4a and 5a heat and vaporize the above substances A and B separately and control the temperatures of each of the crucibles 4 and 5 so that the pressures of vapors in the crucibles 4 and 5 may be kept at predetermined values respectively. The temperature of the crucible 4 or 5 may be controlled by detecting the actual temperature of the crucible 4 or 5 using a thermocouple, comparing the detected actual temperature with a set value of temperature to find out the deviation therebetween, and regulating heat generated from the heating device 4a or 5a according to the above-mentioned deviation.

In addition to the resistance heating method using the above-mentioned heating devices 4a and 5a, the crucibles 4 and 5 may be heated by other suitable methods including the direct resistance heating method which make electric current flow directly in the walls of the crucibles, the electron impact method and the high-frequency heating method.

Reference numerals 6 and 7 designate communication pipes which connects the mixing chamber 3 to each of the crucibles 4 and 5. Thus, the vapors Am and Bm of the substances A and B in the crucibles 4 and 5 are fed to the mixing chamber 3 through the communication pipes 6 and 7, respectively.

The communication pipes 6 and 7 are heated by suitable heating devices to be kept at temperatures equal to or higher than the temperatures of the respective crucibles 4 and 5 so that the vapors Am and Bm passing through the pipes 6 and 7 may not deposit and coagulate on the inside surfaces of the walls thereof respectively. Besides, heating devices 6a and 7a are provided around the parts of the communication pipes 6 and 7 in the vicinity of the inlets of the mixing chamber 3 to heat the above-mentioned parts together with the mixing chamber 3 to a temperature equal to or higher than the temperature of one of the above crucibles 4 and 5 higher in temperature than the other so that a hot vapor flowing into the mixing chamber 3 from the above higher-temperature crucible may be prevented from flowing reversely into the communication pipe leading to the lower-temperature crucible and depositing and coagulating on the wall of the communication pipe.

Hereinafter described is the method of producing compounds according to the present invention by the use of the apparatus mentioned above and shown in FIG. 1.

First, the crucibles 4 and 5 are supplied with substance-to-be-vaporized A and B containing the component elements of a desired compound respectively. When a compound semiconductor is to be produced, substances containing the component elements of a III–V compound semiconductor are employed as the above-mentioned substances-to-be-vaporized. In this case, the crucible 4 may be supplied with, for instance, a substance containing gallium (Ga) or indium (In) and the crucible 5 with a substance containing arsenic (As) or phosphorus (P).

Then, the crucibles 4 and 5 are heated by the heating devices 4a and 5a to vaporize the substances A and B, respectively. In this case, in order to produce, for instance, a III–V compound semiconductor or a II–VI compound semiconductor in which the ratio of one component element to the other is 1 to 1, the temperatures of the crucibles 4 and 5 are set so that the vapor pressures of the substances A and B may become almost the same.

In addition, the above-mentioned vapor pressures are set at least at 100 times the pressure of the region surrounding the mixing chamber 3 and crucibles 4 and 5. For instance, if the above surrounding region is set at a vacuum the pressure of which is $10^{-4}$ Torr or less, the temperatures of the crucibles 4 and 5 are set so that the above-mentioned pressures may reach about $10^{-2}$ Torr or higher.

The temperature of the mixing chamber 3 and the temperatures of the parts of the communication pipes 6 and 7 in the vicinity of the inlets of the mixing chamber 3 are elevated by the heating devices 3b, 6a and 7a respectively so that they may reach a temperature equal to or higher than the temperature of one of the crucibles 4 and 5 higher in temperature than the other.

Thus, the crucibles 4 and 5 are heated and the substances A and B are vaporized into vapors Am and Bm respectively. The vapors Am and Bm are introduced into the mixing chamber 3 through the communication pipes 6 and 7 respectively. In the mixing chamber 3, the vapors Am and Bm are mixed into a mixed vapor Mx.

In this instance, the vapors Am and Bm are controlled so that the vapor pressures thereof may become almost the same as mentioned above. Therefore, the partial pressures of the vapors Am and Bm are also substantially the same in the mixing chamber 3. As a result, the mixed vapor Mx obtained is a mixture of the vapors Am and Bm homogeneously mixed in a ratio of 1 to 1.

As mentioned hereinabove, the mixing chamber 3 has at least one injection hole 3a, which is surrounded by a high vacuum region the pressure of which is 1/100 or less of the pressure inside the mixing chamber 3. Accordingly, the mixed vapor Mx is jetted into the above vacuum region through the injection hole 3a with high injection energy. Meanwhile, the temperatures of the crucibles 4 and 5 are separately controlled to be kept constant. In the crucibles 4 and 5, the substances A and B are vaporized so that the vapors Am and Bm may be kept at pressures corresponding to the above-mentioned controlled temperatures respectively, while being fed to the mixing chamber 3. As a result, the pressure in the mixing chamber 3 is kept almost constant even when the mixed vapor Mx is jetted from the mixing chamber 3 as mentioned above. For this reason, the mixed vapor Mx is continuously jetted from the mixing chamber 3 into the surrounding high vacuum region through the injection hole 3a.

The mixed vapor Mx thus jetted from the mixing chamber 3 forms atomic groups known as clusters C under the influence of the supercooling phenomenon occurring when the mixed vapor Mx is adiabatically expanded when jetted. Each of the clusters C is normally a group of 1000 to 2,000 atoms loosely connected together by van der Waals forces. In this case, all the mixed vapor Mx jetted is not necessarily formed into clusters C. Strictly speaking, there exist molecular or atomic elements, however, these elements have no influence on the operations and effects of the present invention.

The clusters C move toward the substrate 2 in the form of a beam under the influence of injection energy directivity given thereto when jetted, and impinge and deposit on the substrate 2 to form thereon a film 11 of the desired compound.

When the clusters C impinge on the substrate 2, the injection energy thereof is converted into sputtering energy for the substrate surface, thermal energy and the like, and the clusters C are broken into atomic particles to produce the so-called surface migration effect in which the above atomic particles roll on the substrate surface to facilitate film formation. Thus, the film 11 of the desired compound can be made which is high in crystal quality and excellent in bonding strength with respect to the substrate 2 and between the atoms thereof.

As mentioned above, the clusters C are produced from the mixed vapor Mx that have uniformly mixed in a mixing chamber 3 according to the stoichiometric composition of a desired compound. Therefore, the clusters C is a mixture in which the clusters of the component elements and those of the compounds containing the component elements are uniformly mixed. In other words, the component elements which have almost the same mixing ratio as the mixed vapor Mx uniformalized in the mixing chamber 3, impinge on the substrate 2 to form the film 11 having a predetermined stoichiometric composition. The surface migration effect in addition to the above-mentioned effect cooperate to make the film 11 on the substrate 2 uniform in composition throughout the whole surface of the substrate 2.

In the above preferred embodiment, the clusters C are made to impinge on the substrate 2 under the influence of the injection energy thereby forming the film 11. However, the clusters C may be ionized to form cluster ions to which a large amount of kinetic energy is given by the action of a strong electric field thereby making them impinge on the substrate 2 with high speed. This example is shown in FIG. 2.

Figure 2:
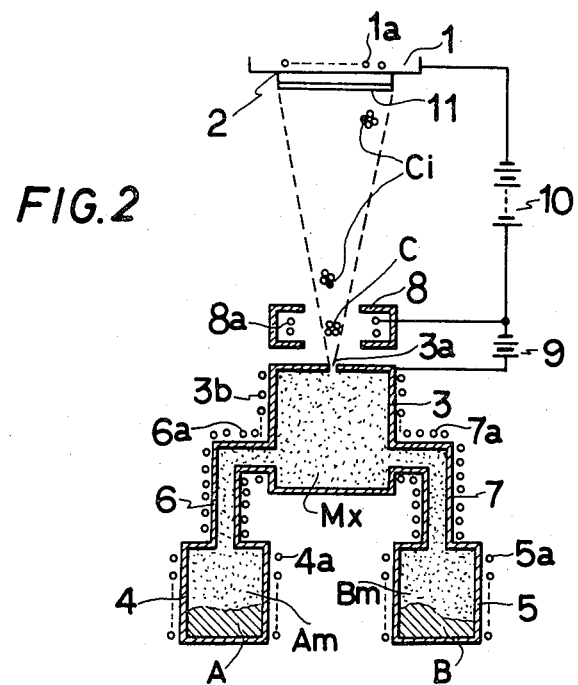
FIGS. 2 to 7 are diagrammatic drawings of the essential parts of apparatuses for producing compounds according to various modifications of the present invention respectively.

Reference is now made to FIG. 2. An ionization chamber 8 having, for instance, a filament 8a for emitting thermions when heated are provided in the vicinity of the injection hole 3a of the mixing chamber 3. Between the ionization chamber 8 and the mixing chamber 3, there is provided a power supply 9 for ionization. A power supply 10 for acceleration is provided between the substrate holder 1 and the ionization chamber 8 if the substrate holder 1 is made of conductive material. If an acceleration electrode is installed at a suitable position between the ionization chamber 8 and the substrate 2, the above power supply 10 for acceleration is provided between the above acceleration electrode and the ionization chamber 8.

In the preferred embodiment shown in FIG. 2, the cluster C enter the ionization chamber 8 under the influence of the injection energy that they have when jetted from the mixing chamber 3. In the ionization chamber 8, the clusters C are bombarded with thermions emitted from the filament 8a, and converted into cluster ions Ci. In this case, the cluster C is changed into the cluster ion Ci when at least one of the atoms of the cluster C is ionized. The cluster ions Ci is accelerated by an electric field formed by the power supply 10 and thereby move towards the substrate 2 with great kinetic energy. These cluster ions Ci together with the neutral clusters C not ionized in the ionization chamber 8 and moving towards the substrate 2 under the influence of the kinetic energy they have when jetted are made to impinge on the substrate 2 to form the film 11 of the desired compound.

In the above embodiment, the cluster ions Ci have great kinetic energy as mentioned above. Therefore, the sputtering energy for the substrate surface, thermal energy, ion implantation energy, and so on converted from the above kinetic energy when the cluster ions Ci impinge on the substrate 2 are much increased. Accordingly, the film 11 obtained is excellent in bonding strength with respect to the substrate 2 and between the atoms of the film 11. In addition, the deposition rate is also improved, and the film 11 can be formed very efficiently.

In the foregoing preferred embodiments, the communication pipes 6 and 7 are formed so that the inside diameters thereof are substantially constant throughout the entire lengths thereof respectively. However, at least one of these communication pipes 6 and 7 may be formed so that the inside diameter thereof are gradually reduced toward the mixing chamber 3, or may be provided with nozzles 6b and 7b at each of the inlet sides of the mixing chamber 3 as shown in FIG. 3 so as to prevent the mixed vapor Mx in the mixing chamber 3 from reversely flowing toward the crucibles 4 and 5.

Figure 3:
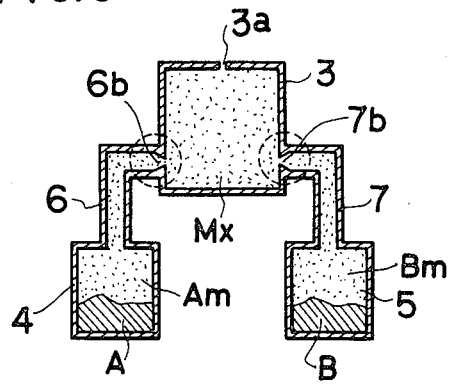

The apparatus shown in FIG. 3 is very effective when the heating temperature for obtaining a predetermined vapor pressure of, for instance, the substance A is far higher than that of the substance B.

More particularly, if the vapor Bm of the substance B or the mixed vapor consisting of the vapors Am and Bm flows into the relatively low temperature regions inside the communication pipe 6 and crucible 4, the vapor deposits and coagulates on the inside surfaces of the walls of the pipe 6 and crucible 4 preventing diffusion of the vapor Am. If, however, the nozzles 6b and 7b are provided at the inlets of the mixing chamber 3 as shown in FIG. 3, the vapors Am, Bm or Mx can be prevented from reversely flowing with respect to the communication pipe 6 or 7.

In addition, if the above-mentioned nozzles 6b and 7b are formed so that the opening areas thereof may be properly selected, the mixing ratio between the vapors Am and Bm can be set at a proper value.

Figure 4:
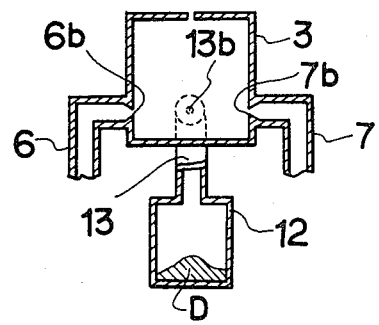

In the apparatus shown in FIG. 4, a third crucible 12 is provided in addition to the crucibles 4 and 5. A communication pipe 13 connecting the crucible 12 to the mixing chamber 3 has a nozzle 13b installed at the inlet of the mixing chamber 3. The nozzle 13b is so formed that it is smaller in opening area than the nozzles 6b and 7b.

The above-mentioned crucible 12 is filled with an impurity element D for determining the conduction type of a compound semiconductor to be produced, and is heated to produce the vapor of the impurity element D, which is fed to the mixing chamber 3. Thus, in the mixing chamber 3, the mixed vapor Mx is mixed with the vapor of the impurity element D, the amount of which is determined according to the ratio of the opening area of the nozzle 13b to those of the nozzles 6b and 7b. In this manner, an N-type or P-type compound semiconductor with a controlled impurity concentration can be obtained.

When, for instance, a GaP light-emitting device as a III–V compound semiconductor is produced, it is well known that the color of the light emitted from the device varies with the kinds of impurity and gas added.

Figure 5:
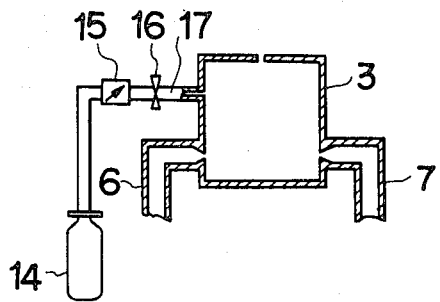

When it is necessary to add such a gas, the apparatus as shown in FIG. 5 may be used. In FIG. 5, a bomb 14 filled with a gas required supplies the gas directly to the mixing chamber 3 through a flow meter 15, needle valve 16 and an inlet pipe 17 while regulating the flow rate of the gas by the inlet pipe 17. In a modified form, the gas may be supplied to the mixing chamber 3 through the inlet pipe connected to either one of the communication pipes 6 and 7.

In all the preferred embodiments mentioned above, the crucibles for heating and vaporizing the substances containing the component elements of a desired compound or the substances for determining the conduction type of the desired compound are provided independently of the mixing chamber 3. However, one of the component elements or impurity elements may be placed in the mixing chamber 3 itself, where it is vaporized and mixed with vapors introduced thereinto from other crucibles and then is jetted therefrom through the injection hole. For instance, the apparatus shown in FIG. 1 can produce a ternary compound, if a substance-to-be-vaporized containing a third component element is placed in the mixing chamber 3. In this case, however, the substance-to-be-vaporized placed in the mixing chamber 3 must be selected so that the heating temperature for obtaining a predetermined vapor pressure thereof is equal to or higher than those of other substances-to-be vaporized.

Figure 6:
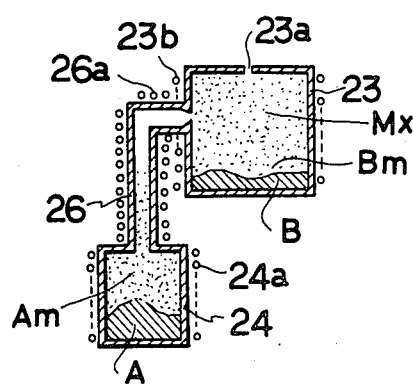

When a binary compound is produced by the above mentioned method which uses the mixing chamber combinedly as a vaporizing chamber, the mixing chamber 3 may be formed integrally with either one of the crucibles and thereby the arrangement of the mixing chamber and crucibles can be simplified as shown in FIG. 6.

In FIG. 6, a mixing chamber 23 is supplied with a substance-to-be-vaporized B which requires a higher heating temperature to obtain a predetermined vapor pressure thereof, and a crucible 24 heated by a heating device 24a is supplied with a substance-to-be-vaporized A which requires a lower heating temperature. The mixing chamber 23 is connected to the crucible 24 through a communication pipe 26 heated and kept at a temperature equal to or higher than the temperature of the crucible 24. Around the portion of the communication pipe 26 near the inlet of the mixing chamber 23, there is provided a heating device 26a to heat that portion and its vicinity to a temperature equal to or higher than the temperature of the mixing chamber 23 heated, which is supplied with the substance B requiring a higher heating temperature.

Thus, the substance A is heated by the heating device 24a, being vaporized into the vapor Am thereof. The vapor Am is introduced into the mixing chamber 23 through the communication pipe 26. In the mixing chamber 23, the vapor Am is mixed with the vapor Bm of the substance B heated and vaporized by the heating device 23b. The mixed vapor Mx thus formed is jetted from the injection hole 23a of the mixing chamber 23.

In this instance, as mentioned above, the communication pipe 26 is kept at a temperature equal to or higher than the temperature of the crucible 24, and in addition the portion of the communication pipe 26 near the inlet of the mixing chamber 23 are kept at a temperature equal to or higher than the temperature of the mixing chamber 23 by means of the heating device 26a. Accordingly, the vapor Am diffused into the communication pipe 26 from the crucible 24 is advantageously prevented from depositing and coagulating on the inside surface of the wall of the communication pipe 26. In addition, the high-temperature vapor Bm is prevented from reversely flowing into the communication pipe 26 from the mixing chamber 23 and from depositing and coagulating on the inside surface of the wall of the communication pipe 26.

Figure 7:
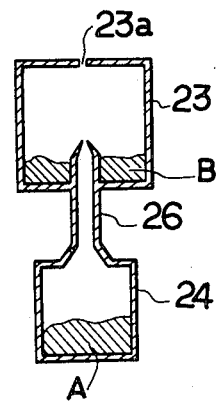

As shown in FIG. 7, the above mixing chamber 23 may be disposed concentrically with the crucible 24 and connected thereto through the communication pipe 26.

While the preferred embodiments of the present invention have been described, it is to be understood that many other modifications and variations will be apparent to those skilled in the art without departing from the spirit of the present invention. For instance, if a plurality of crucibles are provided according to the number of the component elements in the embodiment shown in FIG. 1, 2 or 6, a multiple-element compound can be produced.

It will be apparent from the foregoing description that the method and apparatus for producing compounds according to the present invention have the following features and effects:

The component elements of a desired compound are separately heated and vaporized while thermally and, if necessary, mechanically preventing different kinds of the component elements from mixing with one another. The vapors of these component elements are introduced into a mixing chamber according to a predetermined stoichiometric composition of the desired compound where they are homogeneously mixed to form a mixed vapor. Then, the mixed vapor is jetted into a high vacuum region to form clusters, the clusters are given injection energy and directivity when jetted, and impinge on a substrate. If necessary, the clusters are ionized to form cluster ions, to which a large amount of kinetic energy is given by application of an electric field, and these cluster ions are made to impinge on the substrate at high speed. Thus, a film of the desired compound is formed on the substrate.

Thus, the present invention has the following effects and advantages:

(1) The component elements are separately vaporized. Therefore, a compound consisting of component elements different in physical and thermal properties can be easily produced.

(2) The pressures of the vapors of the component elements are separately controlled, and these vapors are introduced into a closed type mixing chamber where they are mixed. Therefore, the mixing ratio of the component elements can be easily controlled and the mixed vapor obtained is uniform or homogeneous. Thus, a compound having a predetermined stoichiometric composition can be obtained.

(3) A homogeneous mixed vapor the composition of which corresponds to a predetermined stoichiometric composition is deposited on a substrate. Therefore, a homogeneous compound can be obtained throughout the entire surface of the substrate.

(4) The vapors of the component elements are mixed in a mixing chamber according to a predetermined stoichiometric composition, which is made to jet from the injection hole of the mixing chamber with great injection energy. Therefore, the clusters jetted from the injection hole take the form of a beam with strong directivity and impinge on a substrate. As a result, almost all the vapors contribute to the formation of the desired compound and accordingly almost all the materials of the component elements are consumed usefully. Thus, the yield of the compound is very high.

(5) The vapor or gas of an impurity substance for determining the condition type of the desired compound can be easily introduced into the mixing chamber. Therefore, the conduction type can be easily controlled and, in addition, compounds such as nitrides and oxides can be easily produced.

(6) The mixed vapor is deposited on the substrate by the cluster beam deposition process or cluster ion beam deposition process. Therefore, a compound high in crystal quality can be produced. In addition, the cluster ion has a very small e/m value. Therefore, a compound film can be formed even on an insulating substrate.

(7) The vapors of two or more kinds of the component elements are mixed in one common mixing chamber, and the mixed vapor is jetted from the mixing chamber through a common injection hole. Therefore, the apparatus can be made compact and simplified, and the production process can be also simplified.

What is claimed as new and desired to be secured by Letters Patent of the United States is:

1. A method of producing compounds which comprises the steps of separately heating and vaporizing a plurality of substances-to-be-vaporized containing the component elements of a desired compound and placed in a plurality of crucibles respectively to form vapors of said substances, the degree of heating of said crucible being proportional to the vapor pressure of the substance contained therein, feeding said vapors into a heated mixing chamber in a stoichiometric proportion and mixing said vapors therein to form a mixed vapor, jetting said mixed vapor through an aperture in said mixing chamber and into a vacuum region to form clusters, and making said clusters impinge on a substrate under the influence of injection energy given to said clusters when jetted, wherein during the feeding of said vapors into said mixing chamber, said vapors are not initially directed towards said aperture.

2. The method of producing compounds as set forth in claim 1, wherein said step of mixing the vapors of said substances-to-be-vaporized further comprises mixing the vapors of said substances with vapors or gases of impurities for determining the conduction type of the desired compound.

3. A method of producing compounds which comprises the steps of separately heating and vaporizing a plurality of substances-to-be-vaporized containing the component elements of a desired compound and placed in a plurality of crucibles respectively to form vapors of said substances the degree of heating of each said crucible proportional to the vapor pressure of the substance contained therein, feeding said vapors into a heated mixing chamber in a stoichiometric proportion and mixing said vapors therein to form a mixed vapor, jetting said mixed vapor through an aperture in said mixing chamber and into a vacuum region to form clusters, ionizing said clusters to form cluster ions, and giving kinetic energy to said cluster ions thereby making said cluster ions impinge on a substrate, wherein during the feeding of said vapors into said mixing chamber, said vapors are not initially directed towards said aperture.

4. The method of producing compounds as set forth in claim 3, wherein said step of mixing the vapors of said substances-to-be-vaporized further comprises mixing the vapors of said substances with vapors or gases of impurities for determining the conduction type of the desired compound.

* * * * *

UNITED STATES PATENT AND TRADEMARK OFFICE
CERTIFICATE OF CORRECTION

PATENT NO. : 4,281,029
DATED : July 28, 1981
INVENTOR(S) : TOSHINORI TAKAGI ET AL It is certified that error appears in the above—identified patent and that said Letters Patent is hereby corrected as shown below:

Please insert the Assignee Information to read as follows:

[73] Assignee: Futaba Denshi Kogyo K.K.
Mobara-shi, Chiba-ken JAPAN.

Signed and Sealed this

Tenth Day of November 1981

[SEAL]

*Attest:*

GERALD J. MOSSINGHOFF

*Attesting Officer*  *Commissioner of Patents and Trademarks*